United States Patent
Anigbo et al.

[11] Patent Number: 5,881,193
[45] Date of Patent: Mar. 9, 1999

[54] LOW PROFILE OPTICAL SUBASSEMBLY

[75] Inventors: Felix Anigbo, Trexlertown; Mindaugas Fernand Dautartas, Alburtis, both of Pa.; William Michael MacDonald, Lebanon, N.J.; Edward A. Pitman, Harrisburg; David Andrew Ramsey, Allentown, both of Pa.; Dominic Paul Rinaudo, Blandon, Pa.; Yiu-Huen Wong, Summit, N.J.

[73] Assignee: Lucent Technologies Inc., Murray Hill, N.J.

[21] Appl. No.: 764,960

[22] Filed: Dec. 13, 1996

Related U.S. Application Data

[60] Provisional application No. 60/009,116 Dec. 22, 1995.
[51] Int. Cl.$^6$ .................. G02B 6/36; H01S 3/19
[52] U.S. Cl. .................. 385/93; 385/92; 385/94; 372/50; 257/81; 257/98
[58] Field of Search .................. 385/14, 49, 92–94, 385/88, 43; 372/50, 36; 257/81, 84, 98–100

[56] References Cited

U.S. PATENT DOCUMENTS

| | | | |
|---|---|---|---|
| 4,736,231 | 4/1988 | Ayabe et al. | 372/50 |
| 4,945,400 | 7/1990 | Blonder et al. | 372/36 |
| 5,257,336 | 10/1993 | Dautartas | 385/93 |
| 5,617,439 | 4/1997 | Kakimoto | 372/50 |

FOREIGN PATENT DOCUMENTS

| | | |
|---|---|---|
| 0 473 339 A | 8/1991 | European Pat. Off. . |
| 43 13 492 C | 4/1993 | Germany . |
| 2 213 957 | 10/1988 | United Kingdom . |

OTHER PUBLICATIONS

IEEE Transactions on Components, Hybrids and Manufacturing Technology, vol. 15, No. 6, 1 Dec., 1992, pp. 944–954, Cohen, M.S., "Packaging of High–Density Fiber/Laser Modules Using Passive Alignment Techniques".

*Primary Examiner*—Hemang Sanghavi

[57] ABSTRACT

There is disclosed, an optical subassembly includes a platform on which a laser and photodiode are mounted. The laser has a rear facet through which passes a small portion of the light emitted by the laser. The photodiode is mounted on the surface of the platform with a light admitting facet for receiving a portion of the light emitted from the rear facet of the laser being substantially perpendicular to the light emitting facet of the laser. The surface of the platform may include a channel. The channel may be tapered from a narrower end near the laser to a wider end near the photodiode, and may be coated with a light-reflective material.

11 Claims, 2 Drawing Sheets

LOW PROFILE OPTICAL SUBASSEMBLY

TECHNICAL FIELD

This invention relates to a laser and optical subassembly, and in particular to a laser or optical subassembly in which the primary light admitting facet of a photodiode is positioned substantially perpendicular to the light emitting facet of the laser chip.

BACKGROUND OF THE INVENTION

Optical subassemblies on which a laser chip and photodiode are mounted on a platform typically have the light admitting surface of the photodiode aligned with and directly facing the back facet of the laser chip to receive a portion of the light emitted through the back facet of the laser chip. Since only a small portion of the light emitted from the laser chip is emitted through the rear facet, it is important to capture a substantial portion of the light emitted from the laser chip rear facet as input to the photodiode. To maximize the amount of light emitted from the rear facet of the laser that is captured by the photodiode, the light admitting surface of the photodiode has been positioned in the cone of diverging emitted light from the rear facet of the laser chip. Positioning one of the larger light admitting surfaces of the photodiode parallel to the light emitting rear facet of the laser chip results in the largest amount of light falling on the active region of the photodiode.

One problem in positioning the photodiode in this manner is that the photodiode must be first mounted on a carrier, which is in turn mounted on the subassembly. The carrier mounted photodiode is typically substantially taller than the other components, and tends to be the constraint for residual package height. This increases the cost and complexity of the subassembly, and necessitates wire bonding around comers of the photodiode.

SUMMARY OF THE INVENTION

In accordance with an illustrative embodiment of the invention, an optical subassembly includes a platform on which a laser and photodiode are mounted. The laser has a rear facet through which passes a small portion of the light emitted by the laser. The photodiode is mounted on the surface of the platform with a light admitting facet for receiving a portion of the light emitted from the rear facet of the laser being substantially perpendicular to the light emitting facet of the laser. The surface of the platform may include a channel. The channel may be tapered from a narrower end near the laser to a wider end near the photodiode, and may be coated with a light-reflective material.

DETAILED DESCRIPTION

Figure 1:
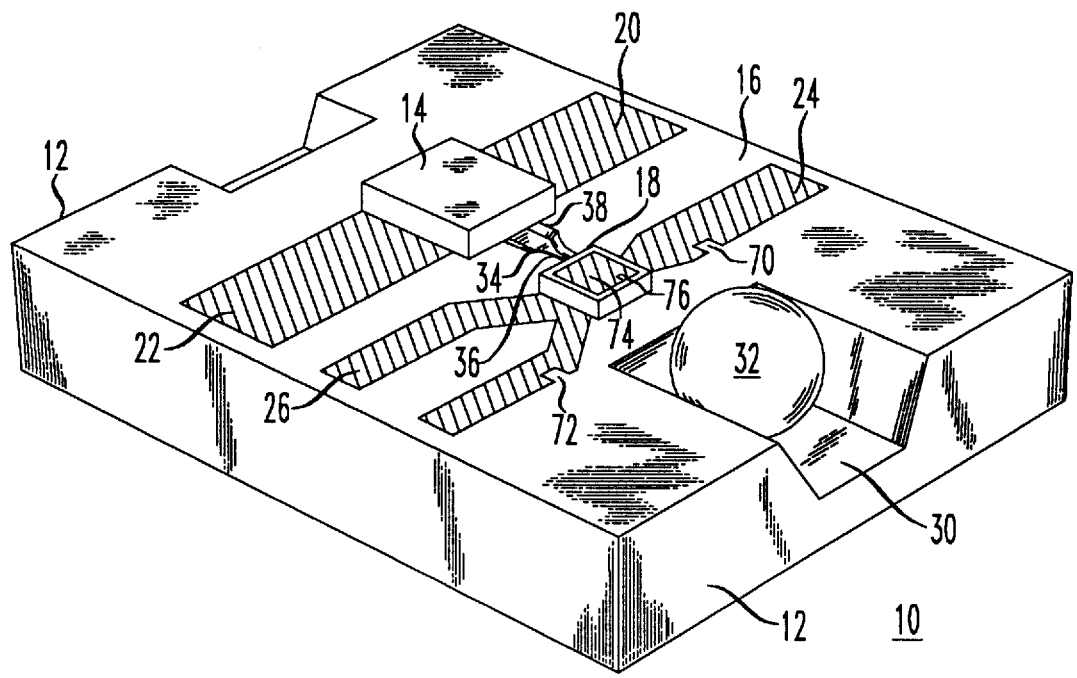
FIG. 1 is a perspective view of an optical subassembly in accordance with the present invention.

FIG. 1 illustrates an optical subassembly 10 in accordance with an illustrative embodiment of the invention. Optical subassembly 10 includes platform 12 which is used to support active optical devices and provide electrical connections thereto. Platform 12 is preferably a semiconductor substrate material such as silicon or gallium arsenide in which features may be etched. Alternatively, platform 12 may be any suitable material which may be processed to include various features (i.e., alignment fiducials and other features) with the accuracy necessary for the application.

Photodiode 14 is mounted on first surface 16 of platform 12 to receive light emitted from the rear facet of laser 18, which is also mounted on first surface 16 of platform 12. In a preferred embodiment, laser 18 is a laser bonded with the active area down, adjacent to first surface 16. As is known in the art, photodiode 14 is used to monitor the output of laser 18 and is typically coupled to a feedback circuit, not shown, to compensate for temperature or laser aging. Metalized regions 20 and 22 on first surface 16 are electrically coupled to photodiode 14 to conduct electrical energy to energize photodiode 14 in a final assembly as well as during testing. Similarly, metallized regions 24 and 26 on first surface 16 are electrically coupled to laser 18 to conduct electrical energy to laser 18 in a final assembly (shown in FIG. 4), as well as during testing. First surface 16 includes an elongate alignment fiducial 30 for receiving and positioning spherical lens 32. Lens 32 collimates the beam of light emitted from the forward face of laser 18 for use external to the laser package.

Fiducial 70 in metalized region 24 and fiducial 72 in metalized region 26 are precisely positioned relative to fiducial 30. Laser 18 may have a metalized region 74 on the upper surface with a fiducial 76 therein. Fiducials 70, 72 and 76 are positioned during a masking operation, which permits them to be located very precisely. When laser 18 is positioned on platform 12, laser 18 is precisely located by locating fiducial 76 relative to fiducials 70 and 72. This assures that the laser is precisely located relative to both fiducial 30 and lens 32.

Laser 18 is mounted on a first surface 16 of platform 12 with a light emitting rear facet 42 oriented toward photodiode 14. A relatively small portion of light emitted by laser 18 passes through light emitting facet 42. Photodiode 14 is also mounted on first surface 16 of platform 12 with a primary light admitting facet 44, for receiving a portion of the light emitted from rear facet 42 of laser 18, oriented substantially perpendicular to the light emitting rear facet 42 of laser 18. In a preferred embodiment, light admitting facet 44 is a major surface of photodiode 14. It is preferred that at least a portion of light admitting face 44 of photodiode 14 be adjacent to first surface 16.

Figure 2:
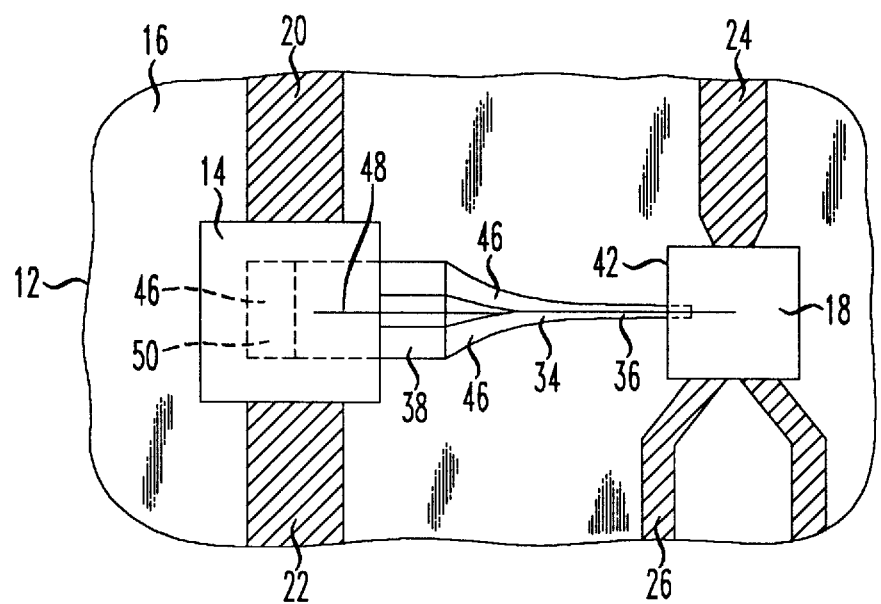
FIG. 2 is a top view of a portion of the optical subassembly of FIG. 1, showing the channel in more detail.
Figure 3:
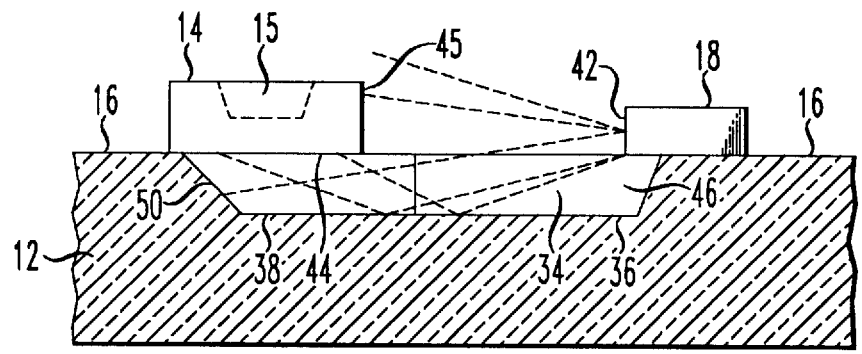
FIG. 3 is a side view of a portion of the optical subassembly of FIG. 1, showing the channel in more detail.

As shown in FIGS. 1, 2, and 3, platform 12 also includes a channel 34 extending from a first, narrower end 36 proximate light emitting rear facet 42 of laser 18 to a second, wider end 38 proximate photodiode 14. Channel 34 is etched into platform 12 from first surface 16 to a predetermined depth. Channel 34 widens in the direction from the laser toward the photodiode, similar to the divergence of light emitted from light emitting rear facet 42. In a preferred embodiment, divergence of the channel is at a smaller angle than the angle of divergence of the laser light emitted from rear facet 42. Channel 34 is preferably symmetric about center line 48. Preferably, the surface or surfaces 46 in platform 12, recessed from first surface 16, that define channel 34 are coated with a light reflective material, such as aluminum or gold. Such a light-reflective material can be deposited during the processing of platform 12.

As best seen in FIG. 3, not all of the light emitted from light emitting rear facet 42 is received directly at the light admitting facet 44 of photodiode 14. A large portion of the light entering channel 34 is reflected from surfaces 46, due to the shape of channel 34 and the reflectivity of the surfaces 46, to direct the reflected light toward light admitting facet 44 of photodiode 14.

Channel 34 contributes to light emitted from laser 18 entering the active region 15 of photodiode 14. Some of the light emitted from laser 18 passes directly through forward facet 45, which in a preferred embodiment is a minor surface of photodiode 14, to impinge on the active region 15. Photons that do not impinge directly on the active region may reflect from the various facets, but are less likely to impinge on the active region, and thus are less likely to be converted into electrical energy. It is desirable to direct the laser light directly toward the active region 15, through a minimum length path of detector material from which photodiode 14 is made.

The narrower first end 36 of channel 34 may extend beneath a portion of laser 18 to provide some tolerance in the positioning of laser 18. The wider second end 38 of channel 34 extends beneath a portion of photodiode 14 to permit light to enter light admitting facet 44 of photodiode 14. Channel 34, at wider second end 38, terminates in an end surface 50 which acts as a turning mirror that is angularly oriented to reflect at least a portion of the light impinging thereon toward light admitting facet 44. Photodiode 14 engages upper surface 16 adjacent that portion of channel 34 that extends beneath photodiode 14. Engagement of laser 18 with upper surface 16 provides a heat sink for dissipation of heat generated in laser 18.

Figure 4:
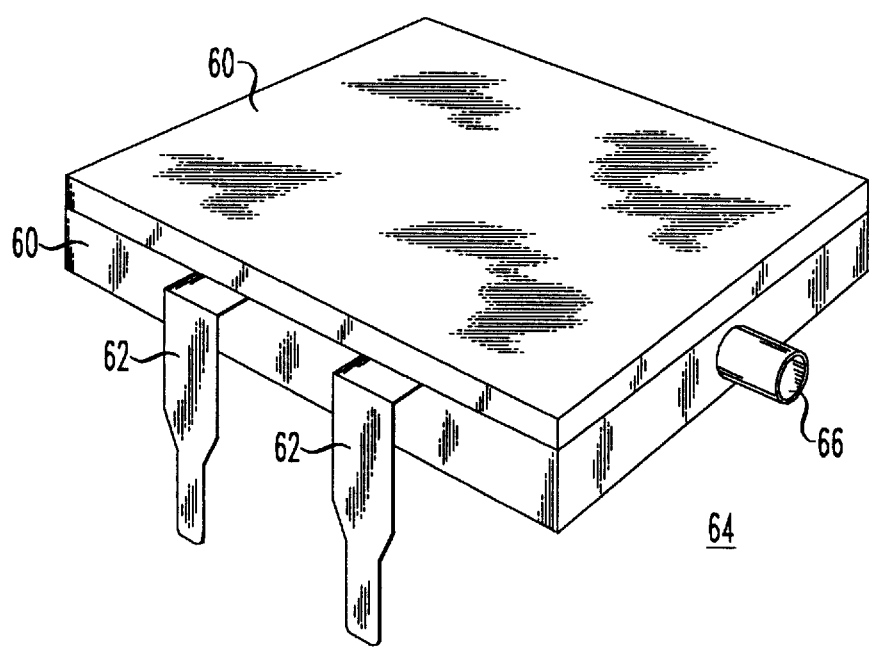
FIG. 4 is a perspective view of a laser package incorporating the subassembly of FIG. 1.

As shown in FIG. 4, a plastic housing 60 with contacts 62 is placed over subassembly 10, resulting in laser package 64. Light may be emitted through port 66 or a fiber (not shown) may be coupled thereto. Contacts 62 are electrically coupled, such as by wire bonding, to corresponding ones of the metallized regions 20–26.

The invention provides the advantage of a laser package requiring fewer and less complex assembly steps than previous laser packages. Furthermore, the package height can be reduced when compared to the height of a package in which the photodiode is mounted on a carrier.

The invention claimed is:

1. An optical subassembly, comprising a platform having a surface;

a laser mounted on the surface of the platform, the laser having a rear facet through which a portion of the light emitted by the laser passes;

a photodiode mounted on the surface of the platform, the photodiode having a light admitting facet for receiving a portion of the light emitted from the rear facet of the laser, the light admitting facet of the photodiode being substantially perpendicular to the light emitting facet of the laser; and a channel recessed in the surface of the platform, the channel extending from a first end proximate the light emitting facet of the laser to a second end proximate the photodiode, wherein the channel has a narrow first end and a wider second end, the channel widening from the laser toward the photodiode.

2. An optical subassembly as recited in claim 1, wherein the second end of the channel extends beneath the photodiode.

3. An optical subassembly as recited in claim 1, wherein the channel is symmetric about a center line extending from the laser to the photodiode.

4. An optical subassembly as recited in claim 1, wherein the first end of the channel extends beneath the laser.

5. An optical subassembly as recited in claim 1, wherein the channel defines an inner surface, at least a portion of the inner surface being coated with a light-reflective material.

6. An optical subassembly as recited in claim 5, wherein the light reflective material is aluminum.

7. An optical subassembly as recited in claim 5, wherein the light reflective material is gold.

8. An optical subassembly as recited in claim 1, further comprising the second end of the channel terminating in an end surface, the end surface being angularly oriented to reflect at least a portion of the light impinging thereon toward the light admitting facet of the photodiode.

9. An optical subassembly as recited in claim 1, further comprising a housing enveloping the subassembly forming a laser transmitter package.

10. An optical subassembly as recited in claim 1, further comprising:

a lens receiving fiducial recessed in the surface of the platform for receiving a lens; and a pair of laser positioning fiducials on the surface, the laser positioning fiducials precisely positioned relative to the lens receiving fiducial, the laser precisely positioned relative to the laser positioning fiducials, whereby the laser is precisely positioned relative to the lens receiving fiducial.

11. An optical subassembly, as recited in claim 10, further comprising:

a lens received in the lens receiving fiducial, whereby the laser is precisely positioned relative to the lens.

* * * * *